(12) United States Patent
Lee (10) Patent No.: US 7,919,400 B2
(45) Date of Patent: Apr. 5, 2011

(54) METHODS FOR DOPING NANOSTRUCTURED MATERIALS AND NANOSTRUCTURED THIN FILMS

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 250 days.

(21) Appl. No.: 12/163,443

(22) Filed: Jun. 27, 2008

(65) Prior Publication Data

US 2009/0017605 A1      Jan. 15, 2009

Related U.S. Application Data

(60) Provisional application No. 60/948,754, filed on Jul. 10, 2007.

(51) Int. Cl.
*H01L 21/04* (2006.01)
(52) U.S. Cl. .................................... 438/510; 977/855
(58) Field of Classification Search .................. 438/510; 977/855
See application file for complete search history.

(56) References Cited

U.S. PATENT DOCUMENTS

| | | |
|---|---|---|
| 4,335,266 A | 6/1982 | Mickelsen et al. |
| 4,441,113 A | 4/1984 | Madan |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |

(Continued)

FOREIGN PATENT DOCUMENTS

AU        7865198        2/1999

(Continued)

OTHER PUBLICATIONS

Y. Zhang et al., "Heterostructures of Single-Walled Carbon Nanotubes and Carbide Nanorods", Science vol. 285, Sep. 10, 1999, pp. 1719-1722.*
G. Counio et al., "CdS:Mn Nanocrystals in Transparent Xerogel Matrices: Synthesis and Luminescence Properties", Journal of Physical Chemistry, vol. 100, 1996, pp. 20021-20026.*
Steven C. Erwin et al., "Doping Semiconductor Nanocrystals", Nature, vol. 436, Jul. 7, 2005, pp. 91-94.*
Moonsub Shim et al., "n-type colloidal semiconductor nanocrystals", Nature, vol. 407, Oct. 26, 2000, pp. 981-983.*
International Solar Electric Technology, Inc. (ISET) "Thin Film CIGS", http://www.isetinc.com/cigs.html, Oct. 1, 2008.

(Continued)

*Primary Examiner* — W. David Coleman
(74) *Attorney, Agent, or Firm* — Kilpatrick Townsend & Stockton LLP (57) ABSTRACT

A method for introducing one or more impurities into nanostructured materials. The method includes providing a nanostructured material having a feature size of about 100 nm and less. The method includes subjecting a surface region of the nanostructured material to one or more impurities to form a first region having a first impurity concentration within a vicinity of the surface region. In a specific embodiment, the method includes applying a driving force to one or more portions of at least the nanostructured material to cause the first region to form a second region having a second impurity concentration.

56 Claims, 9 Drawing Sheets

U.S. PATENT DOCUMENTS

| | | | |
|---|---|---|---|
| 4,661,370 A | 4/1987 | Tarrant | |
| 4,663,495 A | 5/1987 | Berman et al. | |
| 4,724,011 A | 2/1988 | Turner et al. | |
| 4,751,149 A | 6/1988 | Vijayakumar et al. | |
| 4,775,425 A | 10/1988 | Guha et al. | |
| 4,798,660 A | 1/1989 | Ermer et al. | |
| 4,816,082 A | 3/1989 | Guha et al. | |
| 4,915,745 A | 4/1990 | Pollock et al. | |
| 4,950,615 A | 8/1990 | Basol et al. | |
| 4,996,108 A | 2/1991 | Divigalpitiya et al. | |
| 5,008,062 A | 4/1991 | Anderson et al. | |
| 5,028,274 A | 7/1991 | Basol et al. | |
| 5,039,353 A | 8/1991 | Schmitt | |
| 5,045,409 A | 9/1991 | Eberspacher et al. | |
| 5,078,803 A | 1/1992 | Pier et al. | |
| 5,125,984 A | 6/1992 | Kruehler et al. | |
| 5,133,809 A | 7/1992 | Sichanugrist et al. | |
| 5,137,835 A | 8/1992 | Karg | |
| 5,180,686 A | 1/1993 | Banerjee et al. | |
| 5,211,824 A | 5/1993 | Knapp | |
| 5,231,047 A | 7/1993 | Ovshinsky et al. | |
| 5,248,345 A | 9/1993 | Sichanugrist et al. | |
| 5,261,968 A | 11/1993 | Jordan | |
| 5,298,086 A | 3/1994 | Guha et al. | |
| 5,336,623 A | 8/1994 | Sichanugrist et al. | |
| 5,346,853 A | 9/1994 | Guha et al. | |
| 5,474,939 A | 12/1995 | Pollock et al. | |
| 5,501,744 A | 3/1996 | Albright et al. | |
| 5,512,107 A | 4/1996 | Van den Berg | |
| 5,536,333 A | 7/1996 | Foote et al. | |
| 5,578,503 A | 11/1996 | Karg et al. | |
| 5,665,175 A | 9/1997 | Safir | |
| 5,676,766 A | 10/1997 | Probst et al. | |
| 5,977,476 A | 11/1999 | Guha et al. | |
| 5,981,868 A | 11/1999 | Kushiya et al. | |
| 5,985,691 A | 11/1999 | Basol et al. | |
| 6,040,521 A | 3/2000 | Kushiya et al. | |
| 6,048,442 A | 4/2000 | Kushiya et al. | |
| 6,092,669 A | 7/2000 | Kushiya et al. | |
| 6,127,202 A | 10/2000 | Kapur et al. | |
| 6,166,319 A | 12/2000 | Matsuyama | |
| 6,310,281 B1 | 10/2001 | Wendt et al. | |
| 6,328,871 B1 | 12/2001 | Ding et al. | |
| 6,372,538 B1 | 4/2002 | Wendt et al. | |
| 6,690,041 B2 | 2/2004 | Armstrong et al. | |
| 6,852,920 B2 | 2/2005 | Sager et al. | |
| 6,878,871 B2 | 4/2005 | Scher et al. | |
| 7,194,197 B1 | 3/2007 | Wendt et al. | |
| 7,319,190 B2 | 1/2008 | Tuttle | |
| 2002/0063065 A1 | 5/2002 | Sonoda et al. | |
| 2003/0075717 A1 | 4/2003 | Kondo et al. | |
| 2004/0095658 A1 | 5/2004 | Buretea et al. | |
| 2004/0110393 A1 | 6/2004 | Munzer et al. | |
| 2004/0245912 A1 | 12/2004 | Thurk et al. | |
| 2004/0252488 A1 | 12/2004 | Thurk | |
| 2005/0287717 A1 | 12/2005 | Heald et al. | |
| 2006/0034065 A1 | 2/2006 | Thurk | |
| 2006/0051505 A1 | 3/2006 | Kortshagen et al. | |
| 2006/0096536 A1 | 5/2006 | Tuttle | |
| 2006/0096537 A1 | 5/2006 | Tuttle | |
| 2006/0096635 A1 | 5/2006 | Tuttle | |
| 2006/0102230 A1 | 5/2006 | Tuttle | |
| 2006/0151844 A1* | 7/2006 | Avouris et al. | 257/411 |
| 2006/0219288 A1 | 10/2006 | Tuttle | |
| 2006/0219547 A1 | 10/2006 | Tuttle | |
| 2006/0220059 A1 | 10/2006 | Satoh et al. | |
| 2007/0089782 A1 | 4/2007 | Scheuten et al. | |
| 2007/0116892 A1 | 5/2007 | Zwaap | |
| 2007/0116893 A1 | 5/2007 | Zwaap | |
| 2007/0151596 A1 | 7/2007 | Nasuno et al. | |
| 2007/0169810 A1 | 7/2007 | Van Duern et al. | |
| 2007/0283998 A1 | 12/2007 | Kuriyagawa et al. | |
| 2007/0289624 A1 | 12/2007 | Kuriyagawa et al. | |
| 2008/0032044 A1 | 2/2008 | Kuriyagawa et al. | |
| 2008/0041446 A1 | 2/2008 | Wu et al. | |
| 2008/0092945 A1 | 4/2008 | Munteanu et al. | |
| 2008/0092953 A1 | 4/2008 | Lee | |
| 2008/0105294 A1 | 5/2008 | Kushiya et al. | |
| 2008/0110495 A1 | 5/2008 | Onodera et al. | |

FOREIGN PATENT DOCUMENTS

| | | |
|---|---|---|
| AU | 2001/40599 A1 | 8/2001 |
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | WO 01/57932 A1 | 8/2001 |
| WO | WO 2005011002 | 2/2005 |
| WO | WO 2007/077171 A2 | 7/2007 |
| WO | WO 2008/025326 A2 | 3/2008 |

OTHER PUBLICATIONS

Kapur et al., "Fabrication of Light Weight Flexible CIGS Solar Cells for Space Power Applications", Mat. Res. Soc. Proc. vol. 668, (2001) pp. H3.5.1-H3.5.6, Materials Research Society, Warrendale, PA 15086.

Kapur et al., Non-Vacuum Printing Process for CIGS Solar Cells on Rigid and Flexible Substrates, 29th IEEE Photovoltaic Specialists Conf., New Orleans, LA, IEEE, (2002) p. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43 (2003).

Kapur et al., "Non-Vacuum Processing of $CuIn_{1-x}Ga_xSe_2$ Solar Cells on Rigid and Flexible Substrates using Nanoparticle Inks", Thin Solid Films, vol. 431-432 (2003) pp. 53-57 Proceedings of Symposium B, European Materials Research Society, Strasbourg, France.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Nanoparticle Oxides Precursor Inks for Thin Film Copper Indium Gallium Selenide (CIGS) Solar Cells", Mat. Res. Soc. Proc. vol. 668, (2001) pp. H2.6.1-H2.6.7, Materials Research Society, Warrendale, PA 15086.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of ZnxCd1_xS Nanocomposites in Polymer Matrices and their Photophysical Properties, Langmuir 1998, 14, pp. 4342-4344.

Yang et al., Fabrication and Characteristics of ZnS Nanocrystals/Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

* cited by examiner

METHODS FOR DOPING NANOSTRUCTURED MATERIALS AND NANOSTRUCTURED THIN FILMS

CROSS-REFERENCES TO RELATED APPLICATIONS

This application claims priority to U.S. Provisional Patent Application No. 60/948,754, filed Jul. 10, 2007, entitled "METHODS FOR DOPING NANOSTRUCTURED MATERIALS AND NANOSTRUCTURED THIN FILMS" by inventor Howard W. H. Lee, commonly assigned and incorporated by reference herein for all purposes.

STATEMENT AS TO RIGHTS TO INVENTIONS MADE UNDER FEDERALLY SPONSORED RESEARCH AND DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

The present invention relates generally to photovoltaic materials. More particularly, the present invention provides a method and structure for manufacture of photovoltaic materials using a doping process for Group IV materials (e.g., silicon, germanium, silicon-germanium alloys), metal oxides such as copper oxides, metals sulfides and the like. Merely by way of example, the present method and structure have been implemented using a nanostructure configuration, but it would be recognized that the invention may have other configurations.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles Calif. Other types of clean energy include solar energy. Specific details of solar energy can be found throughout the present background and more particularly below.

Solar energy generally converts electromagnetic radiation from the sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to the present invention, techniques for manufacture of photovoltaic materials are provided. More particularly, the present invention provides a method and structure for manufacture of photovoltaic materials using a doping process for Group IV materials (e.g., silicon, germanium, silicon-germanium alloys), metal oxides such as copper oxides, metal sulfides and the like. Merely by way of example, the present method and structure have been implemented using a nanostructure configuration, but it would be recognized that the invention may have other configurations.

In a specific embodiment, a method for introducing one or more impurities into a nanostructured material is provided. The method includes providing a nanostructured material having a surface region. The nanostructured material can have a feature size of about 100 nm or less. Examples of such nanostructured material include nanoparticles, nanoporous materials, nano-columns, nanorods, nanotubes, nanostructured thin film and others. The method includes subjecting the surface region to one or more impurities to form a first region having a first impurity concentration within a vicinity of the surface region. The method includes applying a driving force to one or more portions of the nanostructured material to cause the first region to form a second region having a second impurity concentration.

In an alternative embodiment, an alternative method for introducing one or more impurities into a nanostructured material is provided. The method includes providing a substrate characterized by one or more impurities having a first impurity concentration. The substrate includes a surface region and a thickness. The method includes depositing a nanostructured material overlying the surface region of the substrate. The method includes subjecting the nanostructured material and/or the substrate to a driving force to form a first region in the nanostructured material having a second impurity concentration.

Many benefits are provided by ways of embodiments of the present invention. In particular, embodiments according to the present invention provide a method and structures for a nanostructured material having desirable impurity characteristics. Examples of desired characteristics include n or p type doping, controlled resistivity, controlled carrier density, controlled carrier mobility, and so forth. The method has been applied to fabrication of photovoltaic cells. But it should be recognize that embodiments according to the present invention have a much broader range of applicability.

BRIEF DESCRIPTION OF THE DRAWINGS

FIGS. 5-9 is a simplified diagram illustrating an alternative method of introducing impurities into a nanostructured material according to an embodiment of the present invention.

DETAILED DESCRIPTION OF THE INVENTION

According to the present invention, techniques for manufacture of photovoltaic materials are provided. More particularly, the present invention provides a method and structure for manufacture of photovoltaic materials using a doping process for Group IV materials (e.g., silicon, germanium, silicon-germanium alloys) metal oxides such as copper oxides, metal sulfides and the like. Merely by way of example, the present method and structure have been implemented using a nanostructure configuration, but it would be recognized that the invention may have other configurations.

Figure 1:
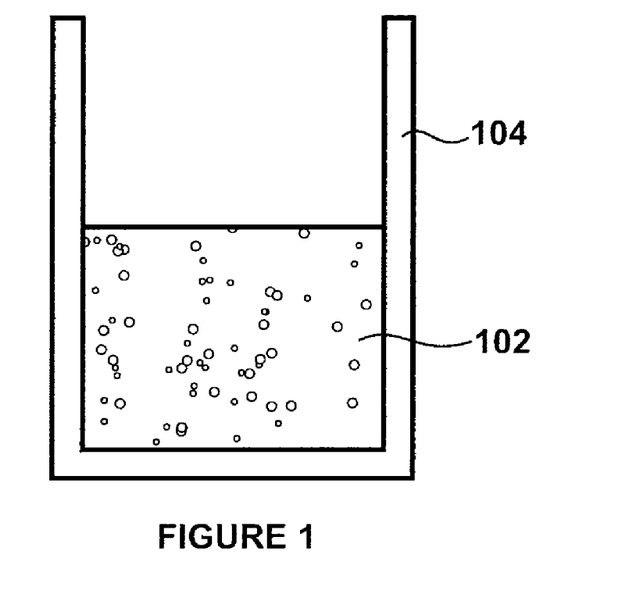
FIGS. 1-4 and FIG. 4A are simplified diagrams illustrating a method of introducing impurities into a nanostructured material according to an embodiment of the present invention.
Figure 2:
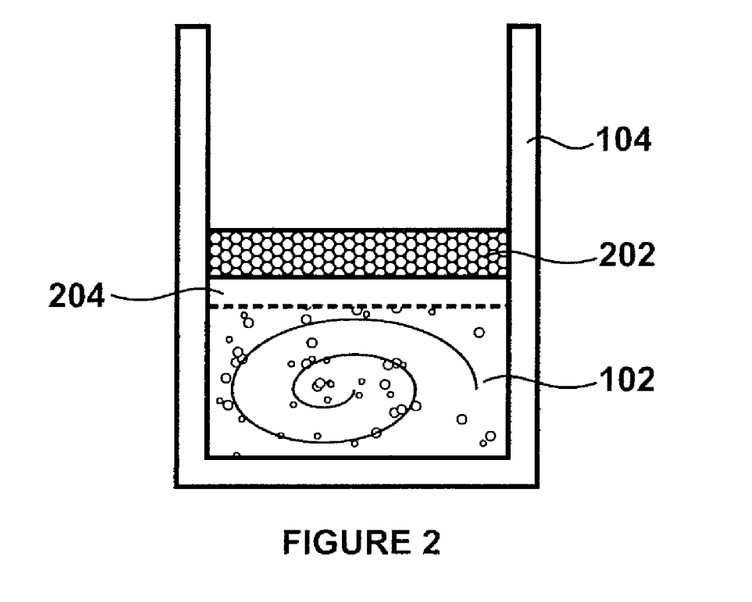
Figure 3:
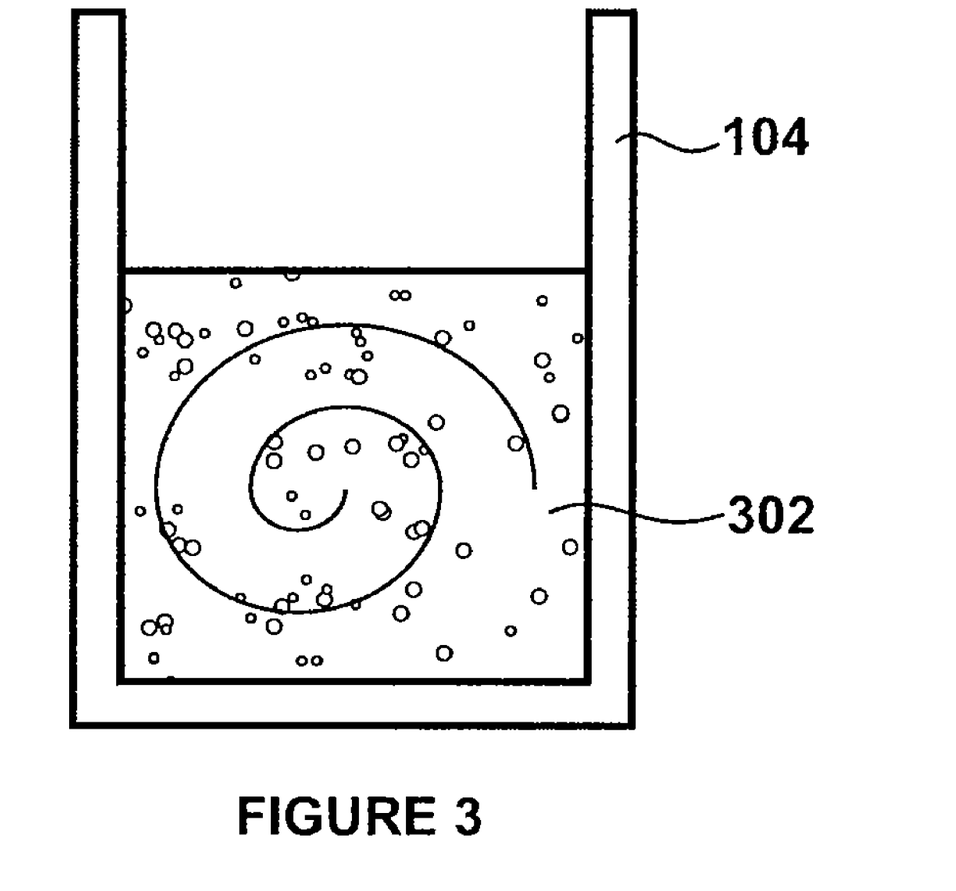

FIGS. 1-3 are simplified diagrams illustrating a method of introducing one or more impurities into a nanostructured material 102 according to an embodiment of the present invention. In a specific embodiment, the nanostructured material is provided in a container 104. The nanostructured material can be provided in a solid state, for example, as a plurality of nanoparticles, nanoporous material, nanotubes, nanocolumns, and others. Alternatively, the nanostructured material can be provided as a colloidal suspension or a slurry, or a gel, in a solution or a suitable liquid medium. One skilled in the art would recognize other modifications, variations, and alternatives.

Referring to FIG. 2, the method includes adding one or more impurities 202 to the nanostructured material to cause the formation of a first region 204 having a first impurity concentration. In an alternative embodiment, the one or more impurities are provided as a precursor. Like references are used in the present figure and others. As shown, the one or more impurities are allowed to distribute over the nanostructured material. Alternatively, the one or more impurities are allowed to intermix with the nanostructured material as shown in FIG. 3.

Depending on the embodiment, a precursor to the nanostructured material may be provided. The precursor to the nanostructured material may be provided in a solid form, for example as a powder. Alternatively, the precursor to the nanostructured material may be provided as a colloid or a slurry suspended in a suitable medium. The method includes adding one or more impurities to the precursor to the nanostructured material to form the first region having a first impurity concentration. The one or more impurities may be distributed over the precursor to the nanostructured material. Alternatively, the one or more impurities may be allowed to intermix with the precursor to the nanostructured material.

Figure 4:
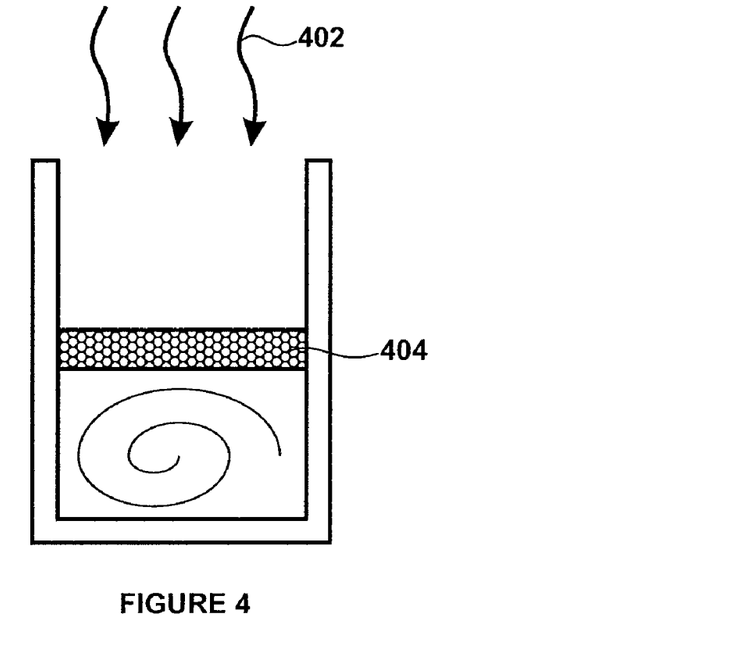

In a specific embodiment, after the one or more impurities are added to the nanostructured material, the combination of materials is subjected to a driving force 402 as illustrated in FIG. 4. The driving force causes the first region of the nanostructured material to have a second impurity concentration. In a specific embodiment, the one or more impurities are allowed to have an even distribution within the nanostructured material and having desired properties. Examples of desired properties include n or p type doping, controlled resistivity, controlled carrier density, controlled carrier mobility, and so forth. The driving force may be provided using a suitable external energy or a combination. For example, the external energy can be provided using a heat source. In certain embodiments, heat is applied such that the temperature is raised to a value of T and for a period of time t such that $[D(T) \cdot t]^{1/2}$ is roughly the desired distance over which the impurity is distributed within the nanostructured material, and which $D(T)$ is the temperature dependent diffusion coefficient of the impurity within the nanostructured material. The external energy source may be provided using pressure. The external energy source may be provided using light energy. Alternatively, the external energy source may be provided using electrical means. The electrical means can include AC or DC fields, electrostatics to cause an electrochemical reaction or electrophoresis and form the doped nanostructured material. The external energy source may also be provided by any combination of these and others. Of course there can be other variations, modifications and alternatives.

Figure 4A:
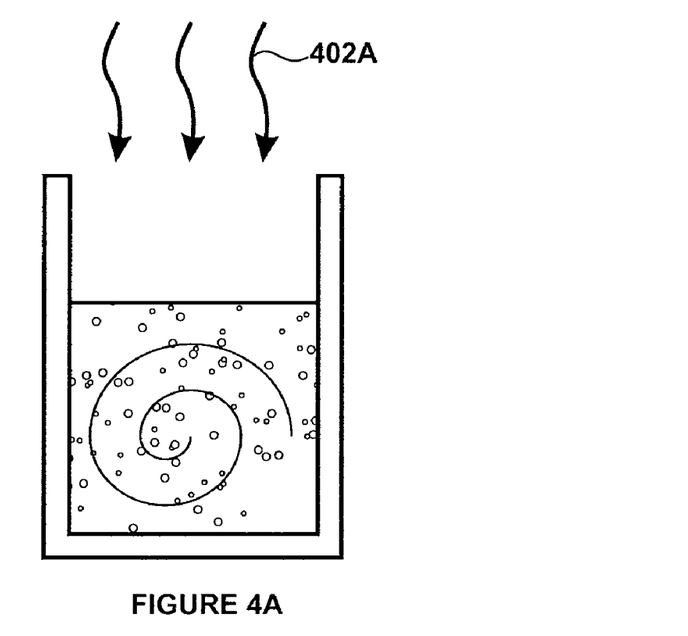

As illustrated in FIG. 4A, the one or more impurities and the nanostructured material after being intermixed, are subjected to a driving force 402A. The driving force causes the nanostructured material to have a third impurity concentration. In a specific embodiment, the one or more impurities are allowed to have an even distribution within the nanostructured material and having desired properties. Examples of desired properties include n or p type doping, controlled resistivity, controlled carrier density, controlled carrier mobility, and so forth. The driving force may be provided using a suitable external energy or a combination. For example, the external energy can be provided using a heat source. In certain embodiments, heat is applied such that the temperature is raised to a value of T and for a period of time t such that $[D(T) \cdot t]^{1/2}$ is roughly the desired distance over which the impurity is distributed within the nanostructured material, and which $D(T)$ is the temperature dependent diffusion coefficient of the impurity within the nanostructured material. The external energy source may be provided using pressure. The external energy source may be provided using light energy. Alternatively, the external energy source may be provided using electrical means. The electrical means can include AC or DC fields, electrostatics to cause an electrochemical reaction or electrophoresis and form the doped nanostructured material. The external energy source may also be provided by any combination of these and others. Of course there can be other variations, modifications and alternatives.

In a specific embodiment, the present invention provides a nanostructured photovoltaic material. In a specific embodiment, the nanostructured material can be a Group IV material. Examples of the Group IV material include silicon or germanium, silicon-germanium alloys, and others. The nanostructured material can be a compound semiconductor such as a III-V material or a II-VI material. The nanostructured material can also be metal oxides such as ZnO, CuO, $Cu_2O$, $Fe_2O_3$, $Fe_3O_4$, TiO, $TiO_2$, $SnO_2$, SnO, $WO_3$ and others. The nanostructured material can also be metal sulfides such as ZnS, $Cu_2S$, $FeS_2$, FeS, SnS, $SnS_2$ and others. Of course there can be other variations, modifications, and alternatives.

FIGS. 5-9 are simplified diagrams illustrating an alternative method of incorporating one or more impurities into a nanostructured material according to an embodiment of the present invention. As shown, a substrate 501 is provided. The substrate includes a surface region 503 and a thickness 505. The substrate can be a semiconductor material (single crystal silicon, polysilicon, germanium, SiGe, silicon on insulator (SOI), and the like), a glass substrate (quartz, fused silica, glass), a metal substrate (stainless steel, aluminum or other suitable metal), a ceramic material, or a multilayer material.

Figure 5:
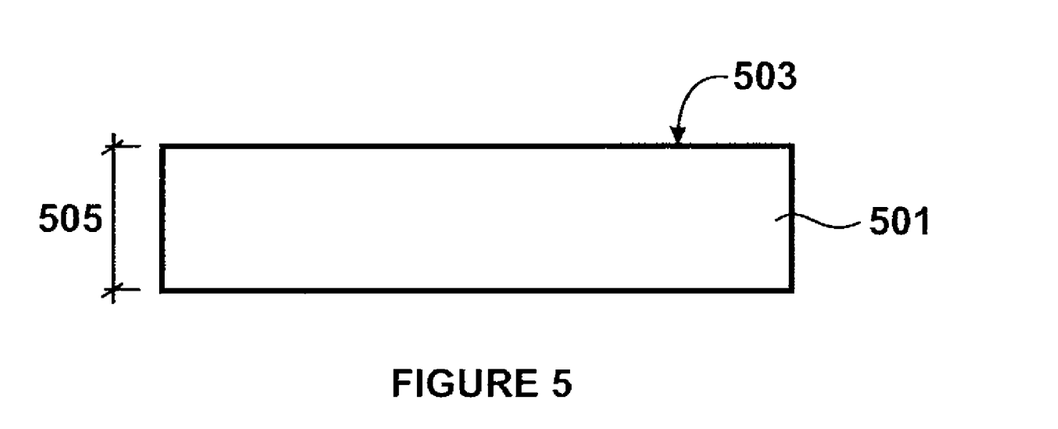

Optionally, before depositing the nanostructured material, the substrate may be subjected to a cleaning process to clean at least the surface region using one or more techniques. In a specific embodiment, the cleaning process can include a wet and/or dry cleaning technique. Examples of such wet cleaning technique include, among others, an RCA clean, a wet dip, an organic wash with solvents such as acetone and/or alcohols, such as isopropyl alcohol, ethanol, any combinations of these and the like. The cleaning process can also include ultra clean water such as deionized water and/or substantially particle free water. In other embodiments, the cleaning process can include a plasma clean using oxygen and/or inert gas species, such as nitrogen, argon, and other suitable gases, and the like. Once cleaning has occurred, the surface region is substantially free from particulates, organic contaminants, metals, and other chemicals, including combinations of these. Of course, one of ordinary skill in the art would recognize other variations, modifications, and alternatives.

Figure 6:
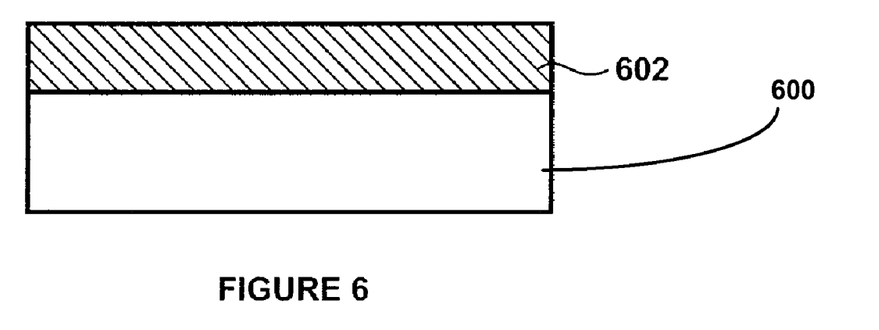
FIGS. 6-9 illustrate a method for introducing impurities into a nanostructured material according to another embodiment of the present invention.

Referring to FIG. 6, the method includes depositing a nanostructured material 602 overlying the surface region of the substrate 600. In a specific embodiment, the nanostructured material can be nanoparticles or nanostructured material having feature size ranging from about 10 nm to about 100 nm. The nanostructured material may be provided using techniques such as chemical synthesis, sputtering, spraying, laser ablation, or other suitable techniques known in the art. In certain embodiments, the nanostructured material may be provided using a deposition, patterned, and etch technique also known in the art. Of course there can be other variations, modifications, and alternatives.

In a specific embodiment, the nanostructured material may be nanoparticles provided in a solution or as colloidal particles suspended in a liquid or a gel. In an alternative specific embodiment, a precursor to the nanoparticles can be used. The precursor to the nanoparticles is preferably converted into the nanostructured material with desired feature size and characteristics. Examples of precursors include chemical precursors that may be converted to the desired nanostructured material by way of a chemical, photochemical, or electrochemical reaction, a combination of these, or the like. The solution or the gel, for example, comprising the precursor to the nanostructured material can be deposited on the surface region of the substrate 600 and allowed to distribute over the surface using many techniques known in the art. In a specific embodiment, the solution or the gel comprising the precursor to the nanostructured material can be deposited on the surface region of the substrate 600 using a spin on technique known in the art. Alternatively, the solution or the gel comprising the precursor to the nanostructured material can be sprayed on the surface region of the substrate 600, also known in the art. Yet alternatively, the substrate 600 can be dipped into a solution comprising the nanostructured material or a precursor to the nanostructured material also known in the art. Yet alternatively, the solution or the gel comprising the precursor to the nanostructured material can be doctor bladed on the surface region of the substrate 600, also known in the art. Of course there can be other variations, modifications, and alternatives.

Figure 7:
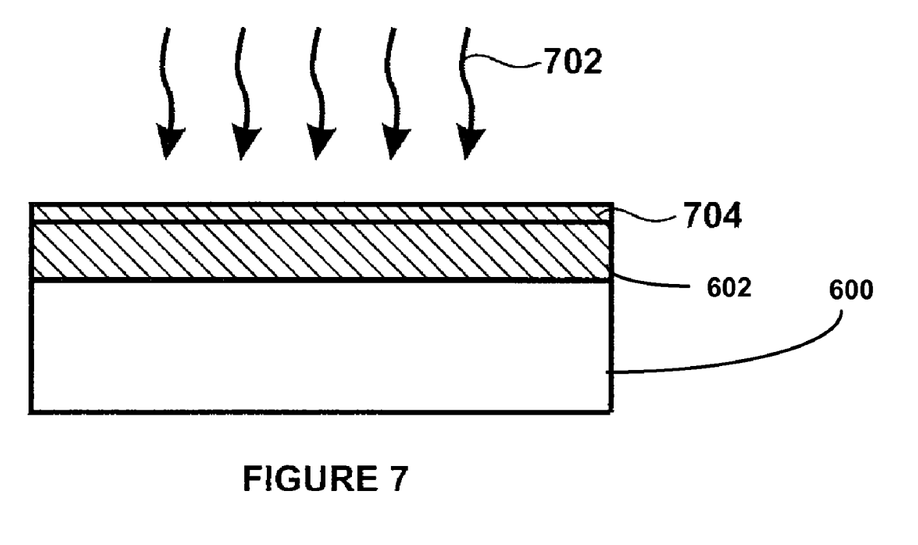

As shown in FIG. 7, the nanostructured material is subjected to one or more impurities 702 to form a first region 704 having a first impurity concentration. The one or more impurities may be provided in a gaseous state in a specific embodiment. The one or more impurities in the gaseous state may be included in a carrier gas in a preferred embodiment. The carrier gas is usually an inert gas such as nitrogen, argon, helium and the like. Of course there can be other variations, modifications, and alternatives.

Figure 8:
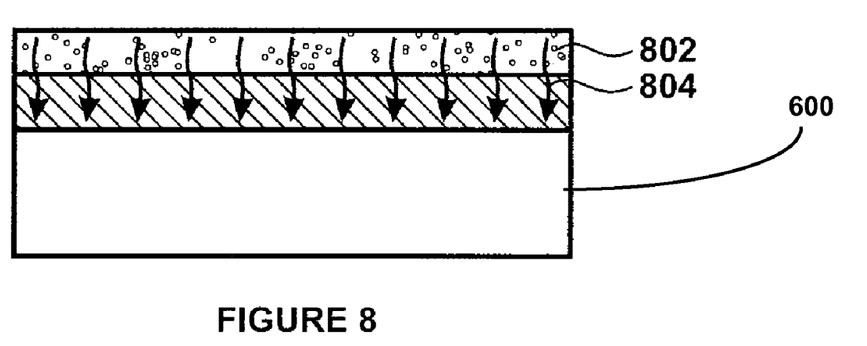

In an alternative embodiment, the one or more impurities may be provided in a solid state 802 as shown in FIG. 8. The one or more impurities in the solid state, after being deposited on the nanostructured material can be allowed, for example, to diffuse into a first region 804 of the nanostructured material to form a first concentration of the one or more impurities in the first region 804. The nanostructured material together with the one or more impurities can be subjected to an external force to cause the one or more impurities to form a second concentration in the first region 804. In a specific embodiment, the one or more impurities are allowed to have an even distribution within the nanostructured material and cause the nanostructured material to have desired characteristics. Examples of desired characteristics include n or p type doping, controlled resistivity, controlled carrier density, controlled carrier mobility, and so forth.

Alternatively, the one or more impurities may be provided as a fluid. For example, the one or more impurities may be provided as a solution, a colloid or a slurry suspending in a suitable medium. In a specific embodiment, the one or more impurities are allowed to distribute over a surface of the nanostructured material, which has been formed on the surface region of the substrate. The solution comprising the one or more impurities may be spun on, sprayed on, cast on, or doctor bladed on an exposed surface of the nanostructured material. Alternatively, the nanostructured material overlying the substrate may be dipped into a solution comprising the one or more impurities.

Figure 9:
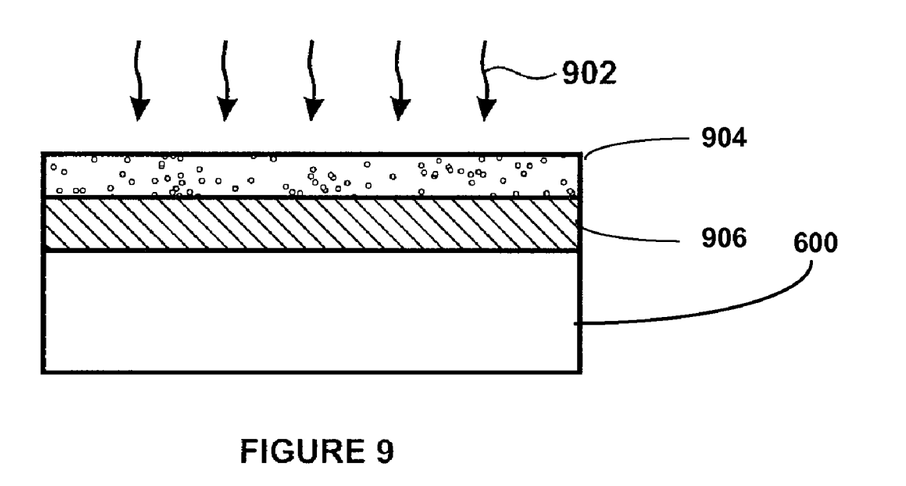

In a specific embodiment as shown in FIG. 9, an external force 902 can be applied to the nanostructured material 906 including the one or more impurities 904 to cause the one or more impurities 904 to be incorporated into the nanostructured material 906. The external force can be applied to a portion of the nanostructured material 906, or a portion of the substrate 600, or a portion of the one or more impurities 904, any combination of these, and others. Preferably, the one or more impurities 904 provide desirable properties for the nanostructured material 906. Examples of desirable properties include n or p type doping, controlled resistivity, controlled carrier density, controlled carrier mobility, and so forth. In a specific embodiment, the external force 902 may be provided using heat, light, electrical means or others or a combination of these. In one embodiment, heat is applied such that the temperature is raised to a value of T and for a period of time t such that $[D(T) \cdot t]^{1/2}$ is roughly the desired distance over which the impurity is distributed within the nanostructured material 906, and which D(T) is the temperature dependent diffusion coefficient of the impurity within the nanostructured material. The electrical means can include electrostatic, AC fields to provide electrochemical reaction or electrophoresis or a combination, depending upon the embodiment.

Figure 10:
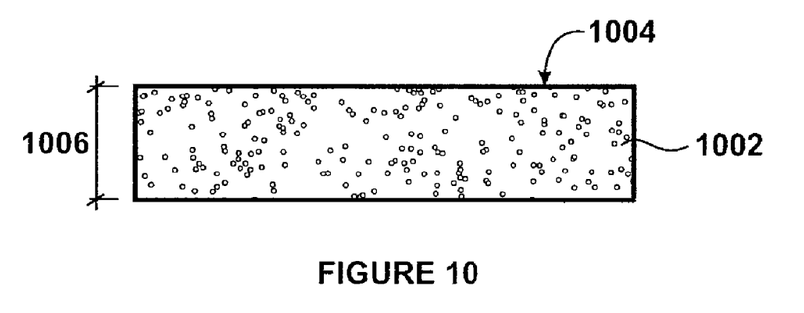
FIGS. 10-12 illustrate a method for introducing impurities into a nanostructured material according to yet another embodiment of the present invention.
Figure 11:
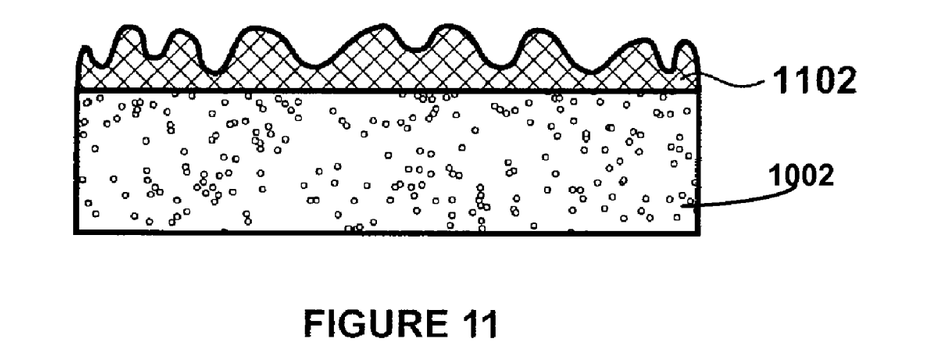
Figure 12:
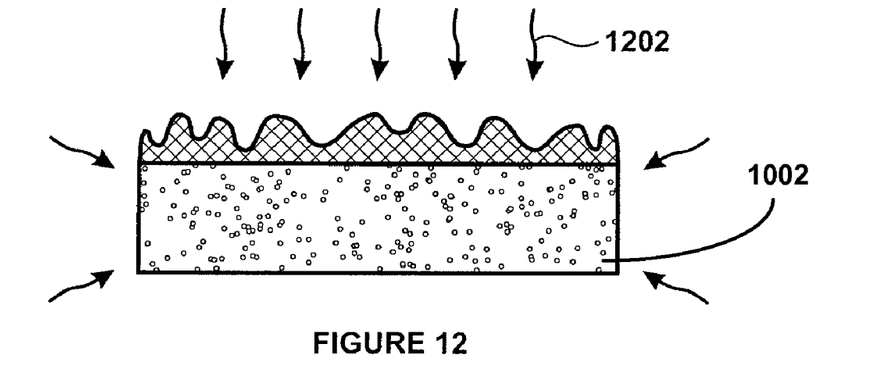

FIGS. 10-12 are simplified diagrams illustrating an alternative method for introducing one or more impurities into a nanostructured material according to an embodiment of the present invention. As shown in FIG. 10, a doped substrate 1002 having a first concentration of one or more impurities is provided. The doped substrate includes a surface region 1004 and a thickness 1006. The doped substrate may comprise of a semiconductor material (single crystal silicon, polysilicon, germanium, SiGe, silicon on insulator (SOI), and the like), a glass substrate (quartz, fused silica, glass), a metal substrate (stainless steel, aluminum or other suitable metal), a ceramic material, or a multilayer material, among others. In a specific embodiment, a nanostructured material 1102 is allowed to deposit in a vicinity of the surface region of the doped substrate as illustrated in FIG. 11. The nanostructured material may be provided as, for example, nanoparticles, nanoporous material, nanotubes, nanocolumns, and others provided using techniques such as chemical synthesis, sputtering, spraying, laser ablation, and others. Alternatively, a precursor to the nanostructured material may also be used, depending upon the application. As shown in FIG. 12, an external force 1202 is applied to the nanostructured material or the doped substrate or both to cause at least a portion of the nanostructured material to have a first impurity concentration. Examples of the external force can include heat, light, pressure, electrical means or any combination of these. In one embodiment, heat is applied such that the temperature is raised to a value of T and for a period of time t such that $[D(T) \cdot t]^{1/2}$ is roughly the desired distance over which the impurity is distributed within the nanostructured material, and which D(T) is the temperature dependent diffusion coefficient of the impurity within the nanostructured material. The electrical means can include electrostatic, AC fields to provide electrochemical reaction or electrophoresis or a combination depending upon the application. Of course there can be other variations, modifications, and alternatives.

Figure 13:
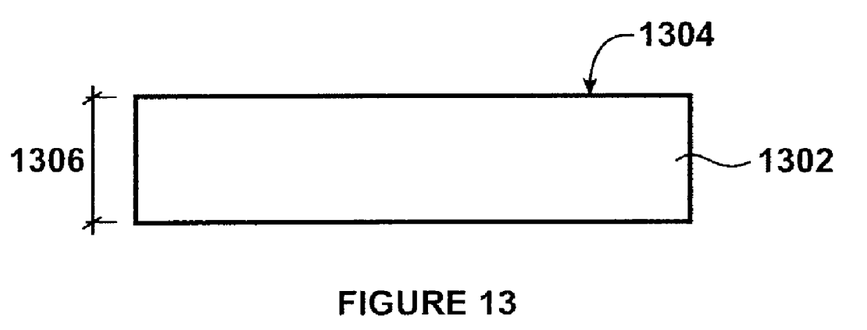
FIGS. 13-15 illustrate a method for introducing impurities into a nanostructured material according to still another embodiment of the present invention.
Figure 14:
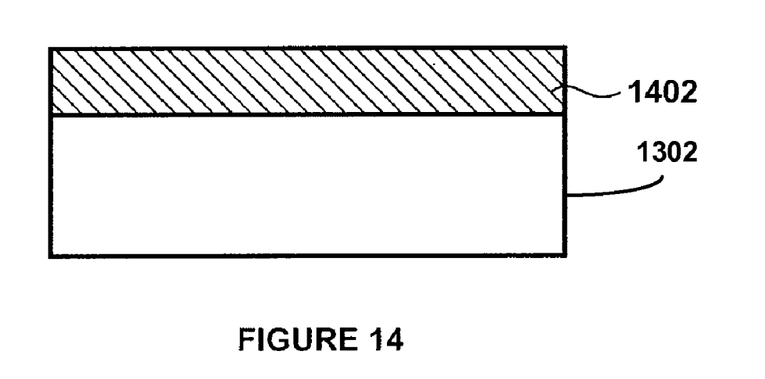
Figure 15:
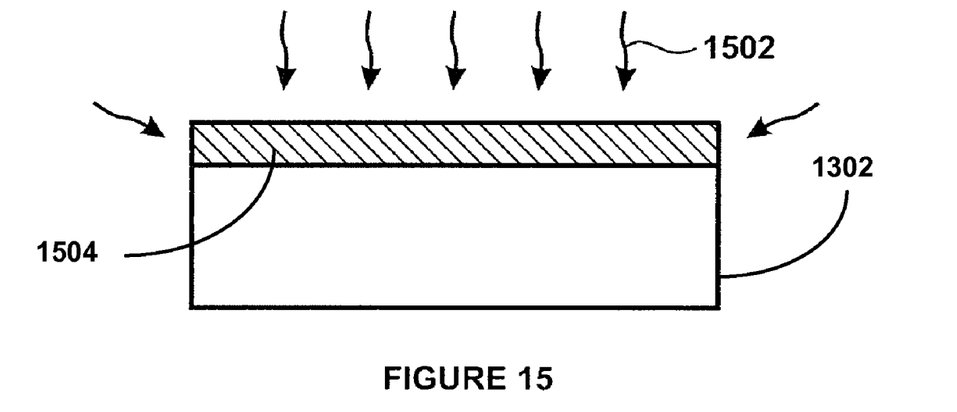

FIGS. 13-15 are simplified diagram illustrating an alternative method for introducing one or more impurities to a nanostructured material according to an embodiment of the present invention. As shown in FIG. 13, a substrate 1302 having a thickness 1304 and a surface region 1306 is provided. The substrate can be a semiconductor material such as Group IV semiconductor, for example single crystal silicon, polysilicon, single crystal germanium, III-V compound semiconductor, for example gallium arsenide, II-VI compound semiconductor, for example zinc oxide, zinc sulfide, cadmium telluride, or cadmium selenide, and the like. The substrate can also be a transparent material such as a glass substrate, quartz, fused silica, and others. Alternatively, the substrate can be a metal such as aluminum or nickel or a metal alloy, such as stainless steel, or other suitable metals depending on the application.

As illustrated in FIG. 14, the method includes depositing a mixture of material 1402 comprising at least a nanostructured material and one or more impurities overlying the surface region of the substrate. The nanostructured material can be nano-particles or a nanoporous material depending on the embodiment. In a specific embodiment, the one or more impurities are mixed and co-deposited with the nanostructured material. Alternatively, the mixture of materials can include at least precursors to the nanostructured material and one or more impurities. Yet alternatively, the mixture of materials can include precursor to the nanostructured material and precursors to the impurities. Still alternatively, the mixture of materials can include the nanostructured material and precursors to the one or more impurities. In a specific embodiment, the mixture of material may be provided in a liquid form such a solution, colloidal particles or slurry suspended in a suitable medium. In an alternative embodiment, the mixture of material can be provided as a mixture of solids. Of course there can be other variations, modifications, and alternatives.

Referring to FIG. 15, the mixture of materials, after deposited onto the substrate member, is subjected to a driving force 1502 to cause the formation of a doped nanostructured material 1504 comprising at least the nanostructured material and the one or more impurities. The driving force may be provided using heat, pressure, light, electrical means or a combination of these. In one embodiment, heat is applied such that the temperature is raised to a value of T and for a period of time t such that $[D(T) \cdot t]^{1/2}$ is roughly the desired distance over which the impurity is distributed within the nanostructured material, and which D(T) is the temperature dependent diffusion coefficient of the impurity within the nanostructured material. The electrical means can include applying AC or DC fields, electrostatic, electrochemical reaction, or electrophoresis depending on the application. Preferably the doped nanostructured material 1504 has a desired feature size and desired characteristics. Examples of desired characteristics include n or p type doping, controlled resistivity, controlled carrier density, controlled carrier mobility, and so forth. Of course there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for introducing one or more impurities into nano-structured materials, the method comprising:
   providing a nanostructured material having a surface region, the nanostructured material having a feature size ranging from about 10 nm to about 100 nm and less;
   subjecting the surface region to one or more impurities to form a first region having a first impurity concentration within a vicinity of the surface region; and
   applying a driving force to the nanostructured material including the one or more impurities to cause the first region to form a second region having a second impurity concentration;
   wherein the nanostructured material comprises one of ZnO, CuO, $Cu_2O$, $Fe_7O_3$, TiO, $TiO_2$ $SnO_2$, SnO, or $WO_3$.

2. The method of claim 1 wherein the nanostructured material comprises nanoparticles, nanotubes, nanocolumns, or nanoporous materials.

3. The method of claim 1 wherein the nanostructured material comprises colloidal particles provided in a suspension or a slurry or a gel.

4. The method of claim 1 wherein the nanostructured material is provided overlying a surface region of a substrate.

5. The method of claim 1 wherein the nanostructured material comprises a nanostructured thin film.

6. The method of claim 1 wherein the nanostructured material is provided in a container.

7. The method of claim 1 wherein the nanostructured material is provided using a precursor material to the nanostructured material.

8. The method of claim 1 wherein the one or more impurities provides for characteristics including n doping or p doping, controlled resistivity, controlled carrier density, or controlled carrier mobility for the nanostructured material.

9. The method of claim 1 wherein the one or more impurities are provided in a solid state, a liquid state, or a gaseous state.

10. The method of claim 1 wherein the one or more impurities are provided using precursors to the one or more impurities.

11. The method of claim 1 wherein the nanostructured material is subjected to a gaseous environment comprising at least the one or more impurities.

12. The method of claim 1 wherein the driving force is one of heat, pressure, electricity, light or a combination thereof.

13. The method of claim 4 wherein the substrate comprises semiconductor material, a glass material, a metal, a ceramic material, or a multilayered material.

14. The method of claim 4 wherein providing the nanostructured material overlying the surface of the substrate comprises using chemical synthesis, sputtering, spraying, or laser ablation.

15. The method of claim 12 wherein the electricity is provided using one of electrostatics, AC fields, electrochemistry, electrophoresis, or a combination thereof.

16. The method of claim 12 wherein the heat is provided to raise a temperature of the nanostructured material, including the one or more impurities, to a value of T in a time period of t, where $[D(T) \cdot t]^{1/2}$ is roughly the desired distance over which the impurity is distributed within the nanostructured material, and $D(T)$ is the temperature dependent diffusion coefficient of the impurity within the nanostructured material.

17. A method for introducing impurities to a nanostructured material, the method comprising:
 providing a substrate characterized by one or more impurities having a first impurity concentration, the substrate having a surface region and a thickness;
 depositing a nanostructured material overlying the surface region of the substrate;
 subjecting the nanostructured material and/or the substrate to a driving force to form a first region in the nanostructured material having a second impurity concentration;
 wherein the nanostructured material is selected from a group consisting of ZnO, CuO, $Cu_2O$ $Fe_2O_3$, TiO, $TiO_2$ $SnO_2$, SnO, and $WO_3$.

18. The method of claim 17 wherein the nanostructured material comprises nanoparticles, nanotubes, nanocolumns, or nanoporous materials.

19. The method of claim 17 wherein the nanostructured material comprises colloidal particles provided in a suspension or a slurry or a gel.

20. The method of claim 17 wherein the nanostructured material comprises a nanostructured thin film.

21. The method of claim 17 wherein the nanostructured material is provided using a precursor material to the nanostructured material.

22. The method of claim 17 wherein the substrate comprises a semiconductor material, a glass material, a metal, a ceramic material, or a multilayered material.

23. The method of claim 17 wherein providing the nanostructured material overlying the surface of the substrate comprises providing the nanostructured material using chemical synthesis, sputtering, spraying, or laser ablation.

24. The method of claim 17 wherein the nanostructured material comprises a nanostructured thin film.

25. The method of claim 17 wherein the one or more impurities provides for characteristics including n doping or p doping, controlled resistivity, controlled carrier density, or controlled carrier mobility for the nanostructured material.

26. The method of claim 17 wherein the driving force is one of heat, pressure, electricity, light or a combination thereof.

27. The method of claim 26 wherein the electricity is provided using one of electrostatics, AC fields, electrochemistry, electrophoresis, or a combination thereof.

28. The method of claim 26 wherein the heat is provided to raise a temperature of the nanostructured material including the one or more impurities to a value of T in a time period of t, where $[D(T) \cdot t]^{1/2}$ is roughly the desired distance over which the impurity is distributed within the nanostructured material, and $D(T)$ is the temperature dependent diffusion coefficient of the impurity within the nanostructured material.

29. A method for introducing one or more impurities into nanostructured materials, the method comprising:
 providing a nanostructured material having a surface region, the nanostructured material having a feature size ranging from about 10 nm to about 100 nm and less;
 subjecting the surface region to one or more impurities to form a first region having a first impurity concentration within a vicinity of the surface region; and
 applying a driving force to the nanostructured material including the one or more impurities to cause the first region to form a second region having a second impurity concentration;
 wherein the nanostructured material is selected from a group consisting of ZnS, $Cu_2S$, $FeS_2$, FeS, SnS, and $SnS_2$.

30. The method of claim 29 wherein the nanostructured material comprises nanoparticles, nanotubes, nanocolumns, or nanoporous materials.

31. The method of claim 29 wherein the nanostructured material comprises colloidal particles provided in a suspension or a slurry or a gel.

32. The method of claim 29 wherein the nanostructured material is provided overlying a surface region of a substrate.

33. The method of claim 29 wherein the nanostructured material comprises a nanostructured thin film.

34. The method of claim 29 wherein the nanostructured material is provided in a container.

35. The method of claim 29 wherein the nanostructured material is provided using a precursor material to the nanostructured material.

36. The method of claim 29 wherein the one or more impurities provides for characteristics including n doping or p doping, controlled resistivity, controlled carrier density, or controlled carrier mobility for the nanostructured material.

37. The method of claim 29 wherein the one or more impurities are provided in a solid state, a liquid state, or a gaseous state.

38. The method of claim 29 wherein the one or more impurities are provided using precursors to the one or more impurities.

39. The method of claim 29 wherein the nanostructured material is subjected to a gaseous environment comprising at least the one or more impurities.

40. The method of claim 29 wherein the driving force is one of heat, pressure, electricity, light or a combination thereof.

41. The method of claim 32 wherein the substrate comprises a semiconductor material, a glass material, a metal, a ceramic material, or a multilayered material.

42. The method of claim 32 wherein providing the nanostructured material overlying the surface of the substrate comprises providing the nanostructured material using chemical synthesis, sputtering, spraying, or laser ablation.

43. The method of claim 40 wherein the electricity is provided using one of electrostatics, AC fields, electrochemistry, electrophoresis, or a combination thereof.

44. The method of claim 40 wherein the heat is provided to raise a temperature of the nanostructured material including the one or more impurities to a value of T in a time period of t, where $[D(T) \cdot t]^{1/2}$ is roughly the desired distance over which the impurity is distributed within the nanostructured material, and D(T) is the temperature dependent diffusion coefficient of the impurity within the nanostructured material.

45. A method for introducing impurities to a nanostructured material, the method comprising:
providing a substrate characterized by one or more impurities having a first impurity concentration, the substrate having a surface region and a thickness;
depositing a nanostructured material overlying the surface region of the substrate;
subjecting the nanostructured material and/or the substrate to a driving force to form a first region in the nanostructured material having a second impurity concentration;
wherein the nanostructured material is one of ZnS, $Cu_2S$, $FeS_2$, FeS, SnS, or $SnS_2$.

46. The method of claim 45 wherein the nanostructured material comprises nanoparticles, nanotubes, nanocolumns, or nanoporous materials.

47. The method of claim 45 wherein the nanostructured material comprises colloidal particles provided in a suspension or a slurry or a gel.

48. The method of claim 45 wherein the nanostructured material comprises a nanostructured thin film.

49. The method of claim 45 wherein the nanostructured material is provided using a precursor material to the nanostructured material.

50. The method of claim 45 wherein the substrate comprises a semiconductor material, a glass material, a metal, a ceramic material, or a multilayered material.

51. The method of claim 45 wherein the nanostructured material is provided overlying the surface of the substrate using techniques such as chemical synthesis, sputtering, spraying, laser ablation, and others.

52. The method of claim 45 wherein the nanostructured material comprises a nanostructured thin film.

53. The method of claim 45 wherein the one or more impurities provides for characteristics including n doping or p doping, controlled resistivity, controlled carrier density, or controlled carrier mobility for the nanostructured material, and others.

54. The method of claim 45 wherein the driving force is one of heat, pressure, electricity, light or a combination thereof.

55. The method of claim 54 wherein the electricity is provided using one of electrostatics, AC fields, electrochemistry, electrophoresis, or a combination thereof.

56. The method of claim 54 wherein the heat is provided to raise a temperature of the nanostructured material including the one or more impurities to a value of T in a time period of t, where $[D(T) \cdot]^{1/2}$ is roughly the desired distance over which the impurity is distributed within the nanostructured material, and D(T) is the temperature dependent diffusion coefficient of the impurity within the nanostructured material.

* * * * *